(12) United States Patent
Paul et al.

(10) Patent No.: US 11,016,162 B2
(45) Date of Patent: May 25, 2021

(54) METHOD AND MAGNETIC RESONANCE APPARATUS FOR GENERATING A COMBINATION IMAGE DATASET (71) Applicant: Siemens Healthcare GmbH, Erlangen (DE)

(72) Inventors: Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 266 days.

(21) Appl. No.: 16/185,528

(22) Filed: Nov. 9, 2018

(65) Prior Publication Data
US 2019/0137590 A1 May 9, 2019

(30) Foreign Application Priority Data
Nov. 9, 2017 (EP) .................................... 17200835

(51) Int. Cl.
*G01R 33/561* (2006.01)
*G01R 33/48* (2006.01)
*G01R 33/56* (2006.01)

(52) U.S. Cl.
CPC ..... *G01R 33/5617* (2013.01); *G01R 33/4828* (2013.01); *G01R 33/5608* (2013.01); *G01R 33/5618* (2013.01)

(58) Field of Classification Search
CPC ............ G01R 33/5617; G01R 33/5618; G01R 33/4828; G01R 33/5608
See application file for complete search history.

(56) References Cited

U.S. PATENT DOCUMENTS

| 5,187,439 A * | 2/1993 | Jensen | G01R 33/4828 324/309 |
| 5,909,119 A * | 6/1999 | Zhang | G01R 33/4828 324/307 |
| 2004/0056660 A1* | 3/2004 | Yatsui | G01R 33/4828 324/309 |
| 2006/0241381 A1* | 10/2006 | Wang | G01R 33/4828 600/410 |
| 2010/0060278 A1* | 3/2010 | Park | G01R 33/4828 324/309 |
| 2014/0285195 A1* | 9/2014 | Stemmer | G01R 33/4818 324/309 |

(Continued)

OTHER PUBLICATIONS

Madhuranthakam et al: "T2-Weighted 3D Fast Spin Echo Imaging With Water-Fat Separation in a Single Acquisition"; Journal of Magnetic Resonance Imaging vol. 32 No. 3; pp. 745-751 (2010).

(Continued)

*Primary Examiner* — Daniel R Miller
(74) *Attorney, Agent, or Firm* — Schiff Hardin LLP (57) ABSTRACT

In a method and magnetic resonance apparatus for generating at least one combination image dataset, a first image dataset is acquired with a turbo spin echo sequence, wherein the echo signals are timed so that the spins of two spin species in the region to be examined are in-phase. A second image dataset is acquired with a turbo spin echo sequence, wherein the echo signals are timed so that the spins of two spin species in the region to be examined have opposed phase. The first image dataset and the second image dataset are combined to form a combination image.

13 Claims, 4 Drawing Sheets

(56) References Cited

U.S. PATENT DOCUMENTS

| | | | |
|---|---|---|---|
| 2016/0033605 A1* | 2/2016 | Stemmer | G01R 33/56509 324/309 |
| 2016/0033606 A1* | 2/2016 | Eggers | G01R 33/5615 324/309 |
| 2016/0041249 A1 | 2/2016 | Lee et al. | |
| 2016/0231406 A1* | 8/2016 | Pedrosa | G01R 33/5615 |

OTHER PUBLICATIONS

Eggers et al.: "Chemical Shift Encoding-Based Water-Fat Separation Methods"; Journal of Magnetic Resonance Imaging vol. 40 No. 2; pp. 251-268; (2014).

Lipton "Manipulating k-Space: Rapid Acquisition with Relaxation Enhancement, Turbo Spin Echo, Fast Spin Echo"; In: "Totally Accessible MRI : A User's Guide to Principles, Technology and Applications"; pp: 177-179; (2008).

\* cited by examiner

METHOD AND MAGNETIC RESONANCE APPARATUS FOR GENERATING A COMBINATION IMAGE DATASET

BACKGROUND OF THE INVENTION

Field of the Invention

In the evaluation of magnetic resonance (MR) measurements, it can be necessary to differentiate between different nuclear spin species. For protons a differentiation can be made in living subjects between water protons and fat protons as spin species, for example.

It is possible to obtain a spatial distribution of the spin species by acquiring spectroscopic image data. Corresponding methods are known by the acronym "CSI".

Description of the Prior Art

A disadvantage of CSI methods is that they are time-consuming, because all spatial directions are encoded with phase-encoding gradients. If it is solely a matter of distinguishing between water and fat in the images, there is also the option of applying a Dixon method. Dixon methods are methods in which two or three image datasets are combined with one another into combination images. The image datasets have been recorded with specific orientations of the phases of the spin species in relation to one another. In one image dataset the spins have the same phase, the so-called "in-phase" situation. It is also said that the spins are in phase. In the second image dataset the species are in "opposed phase". This is also called opposite in phase. If these images are then added or subtracted, a pure water or a pure fat image is obtained. Usually, information about the $B_0$ field is also taken into consideration. The $B_0$ field is the static, homogeneous magnetic field that initially aligns the nuclear spins. The nuclear spins are deflected from this alignment (excited) so as to emit MR signals as they return to the aligned orientation. This is included as phase information.

If gradient echoes are used for recording the MR data, the echo time must be chosen so that the spins, at the point in time at which the data are recorded, or more precisely at the point in time of the center of the echo, are oriented once as "in phase" and once as "opposed phase".

These periods of time are known. The formula for establishing the period of time in which the spins change from the "in-phase" position to the "opposed phase" position is:

$$\Delta t_{in\text{-}opp}=1/(2*B_0*\gamma*3.4 \text{ ppm}),$$

wherein $\gamma$ is the gyromagnetic ration of the spins in question.

The time decreases as the field strength increases. For 0.5 T it lies at 7.2 ms for example, for 1.5 T at 2.4 ms and for 3 T at just 1.2 ms.

If, for example, because of susceptibility artifacts, a spin echo is used for acquisition, then for the recording with the "in-phase" position, this can be carried out as usual. This means that the same length of time is present between the excitation pulse and the refocusing pulse and the refocusing pulse and the center of the echo. In this case, the spin echo generated by the refocusing pulse and the gradient echo generated by the read gradients coincide.

In order to obtain an "opposed phase" position with a spin echo-based recording method, the echo time cannot simply be shortened or lengthened. The spins at the time of the spin echo are always "in-phase". Therefore, with spin echo-based methods, the gradient echo is shifted in relation to the spin echo and the gradient echo is to be recorded.

If bipolar gradients are used, the recording of the echoes can be timed so that first a gradient echo is recorded in the "opposed phase" position, then a spin and gradient echo in the "in-phase" position, and thereafter possibly a second gradient echo once again in the "opposed phase" position.

The second gradient echo can be used in order to achieve a separation of the spin species even with inhomogeneous $B_0$ fields. The images can then be further processed with the 3-point Dixon method. This is obsolete in prior-art magnetic resonance systems, which is why, because of the faster computation, the 2-point Dixon method is usually employed.

In order to shorten the measuring time, a turbo spin echo can be used as the spin echo-based method. A turbo spin echo sequence is a sequence in which an excitation pulse is followed by a number of refocusing pulses and a corresponding number of echoes. Other names for turbo spin echo, abbreviated to TSE, are Fast Spin Echo with the abbreviation FSE or Rapid Acquisition with Relaxation Enhancement, also called RARE. After the recording of an echo, the phase encoding gradient is progressed iteratively, so that in an echo train a number of echoes, and thereby a number of k-space rows of an image dataset, are recorded.

The time between two echoes in an echo train is called the interecho time. The effective echo time is the time at which the central k-space rows are recorded (filled with acquired raw data). Different recording strategies exist with turbo spin echoes. At the start of an echo train, the central k-space rows can be sampled (filled with data) and then sampling can continue outwardly. In this case the echo time and the effective echo time are the same.

However, if the sampling begins at the outer periphery of k-space and then proceeds in the direction of the center and then outwardly again, the echo of the central k-space row is at a position in the center. The effective echo time is then much greater than the echo time.

If a turbo spin echo and bipolar gradients are used during reading out of the echo signals, both image datasets for a 2-point Dixon method can be obtained in roughly the time in which a simple turbo spin echo is recorded.

In this case the problem exists that, with low field strengths, a comparatively long measurement time is needed, since the number of echoes in an echo train is restricted to fewer than 20 echoes, in particular 15 echoes, because of signal losses. In other words, after 15 echoes, there is no longer any signal there that could be measured.

The precise number depends on T2 and can vary according to the region being examined.

SUMMARY OF THE INVENTION

An object of the present invention is to provide a method with which a Dixon method can be executed more quickly, in particular with low field strengths.

This object is achieved by a method for creating at least one combination image dataset, wherein a first image dataset is acquired with a turbo spin echo sequence, wherein the measured echo signals are timed so that the spins of two spin species in the region being examined are in-phase, a second image dataset is acquired with a turbo spin echo sequence, wherein the measured echo signals are timed so that the spins of two spin species in the region being examined are opposed in phase, and the first image dataset and of the second image dataset are combined so as to form a combination image.

The first and second image datasets are respectively reconstructed from the echo signals that were acquired in phase and opposed in phase in the different executions of the turbo spin echo sequence, and the combination image is also produced in that computer. The combination image is made available from the computer in electronic form, as a data file, for storage or display.

The basis of the invention is to record the image data for a Dixon method separately and with a turbo spin echo sequence in each case. This enables the turbo spin echo sequences to be optimized in each case for the measurement data to be recorded. Overall, although the sequences are carried out one after another, a lower measurement time is achieved than when one gradient echo train is used.

Spin echoes arise in the recording of the second image dataset, as will be shown below. In these echoes the spins are in-phase. These echoes are not acquired, however.

In this case, the above statements for the known turbo spin echo sequences continue to apply for the inventive method. The turbo spin echo sequences thus have a number of refocusing pulses in an excitation train.

As is usual, a measurement sequence is a sequence of RF pulses, gradient fields, wait times and acquisition windows, which precisely define and characterize the execution of the measurement sequence. A turbo spin echo sequence is such a measurement sequence.

A measurement sequence in this case is composed of defined sub-acquisitions. A sub-acquisition can also be called an excitation cycle. With a spin echo, as many excitation pulses are applied as there are phase-encoding steps carried out. Accordingly there are as many excitation cycles as phase-encoding steps.

In a turbo spin echo sequence, a number of refocusing pulses are applied in an excitation cycle, which is why, as noted above, the present invention is described as involving an echo train. In the present invention a distinction is made between an echo train as a result of a number of refocusing pulses, and a gradient echo train as a result of read gradients, in particular bipolar read gradients. In a turbo spin echo sequence with 128 phase-encoding steps and a total of 8 echoes in an echo train, this produces exactly 16 excitation cycles in order to record a complete measurement data set.

The length of an excitation cycle is called the repetition time and is abbreviated as "TR".

This information is merely intended to explain the existing conventions known to those skilled in the art.

It also is understood that the recording of an image dataset means recording measurement signals and processing the raw data represented thereby into an image. In this process, the measurement signals are Fourier transformed.

As noted above, a measurement sequence such as a turbo spin echo sequence is defined as a sequence of RF pulses, gradient fields, wait times and acquisition windows. In such cases it should be noted that a number of variations are available. The refocusing pulse can be surrounded by spoiler gradients, but this does not have to occur. The phase encoding gradient can be activated before or after the refocusing gradient, as can the read dephasing gradient. With a turbo spin echo sequence, it is often preferred for these gradients to be activated before the refocusing pulse, but this does not have any physical reasons, and is done because it reduces the programming outlay. The portion of the overall sequence around the refocusing pulse can then be programmed as a repeating module.

The read gradient is applied at least once after each refocusing pulse. It is known that it makes a spatially-dependent encoding possible.

In summary, two image datasets are recorded by two turbo spin echo sequences, wherein in the first image dataset the spins of the spin species are in-phase and in the second they are in opposed phase.

Preferably, exclusively spin echo signals are acquired during the recording of the first image dataset. In the imaging these always coincide with gradient echo signals, but are referred to as spin echo signals.

Preferably, exclusively gradient echo signals are acquired during the recording of the second image dataset.

Preferably, during the recording of the second image dataset, at least two echo signals will be recorded after the application of at least one refocusing pulse. This means that more than one gradient echo is present for each refocusing pulse.

Preferably the echo signals are produced by bipolar gradients. In the present invention, gradients of different polarity are considered as bipolar gradients. This does not have to involve two gradients spaced apart in time, but can be one gradient train with gradients of changing polarity. Three gradients can be applied in the read direction, of which two have a first polarity and the third gradient in the middle has the other polarity. This gradient in the middle is merely necessary to enable the second pure gradient echo to be generated with the third gradient.

Preferably, the measured echo signals are generated by gradients of the same polarity. In the second image dataset, the spin species are measured in the opposed phase position. After these have been measured by gradient echoes, with three gradients of changing polarity, the desired echoes can be obtained during the first and third gradients, because the spin species, as noted, are in the "in-phase" position at the time of a spin echo.

Preferably the two echo signals are parts of a single image dataset. This still involves the gradient echoes that have been acquired after a refocusing pulse. An additional phase encoding gradient can be applied between these, in order to change the data entry in k-space. Then, in one echo train, twice as many gradient echoes, i.e. k-space rows, can be recorded as there are refocusing pulses applied.

Continuing with the example given above, 16 gradient echoes can now be recorded in one excitation cycle instead of 8. The number of excitation cycles during the recording of the second image dataset is thereby halved to 8. The spin echo arising between them is not recorded.

This enables the second gradient of the three bipolar gradients to be switched with a high gradient strength and short duration. Thus the first gradient and the third gradient, and thereby the gradient echoes, can be pushed closer to the spin echo in the middle.

Advantageously, during the recording of the first image dataset, a higher number of refocusing pulses can be applied in an echo train than during the recording of the second image dataset. The fact that no additional gradient echoes are to be recorded during the recording of the spins that are located "in-phase" enables the echo time and also the interecho time to be minimized. Then, with a T2 that naturally remains the same, more refocusing pulses and thereby more spin echoes can be generated.

It is not the case, however, that more echoes will be recorded during the recording of the first image dataset in an excitation cycle, and thus in an echo train. It is true that more refocusing pulses can be applied, but a single spin echo will be generated by these refocusing pulses. During the recording of the second image dataset by contrast, two gradient echoes can be acquired per refocusing pulse. The number of recorded echoes per excitation cycle thus can be higher during the recording of the second image dataset although fewer refocusing pulses are applied in an excitation cycle.

Preferably the echo time and/or the effective echo time and/or the interecho time during the recording of the first image dataset can be smaller than during the recording of the second image dataset. It must still be noted that during the recording of the second image dataset there can be a number of echo times present, namely for the case in which two gradient echoes are acquired per refocusing pulse. One of the gradient echoes takes preference compared to the spin echoes generated during the recording of the second image dataset, i.e. it has a smaller echo time than the spin echo of the second turbo spin echo sequence. Despite this, by optimizing the first turbo spin echo sequence it can be achieved that the shortest echo time and/or interecho time is present during the recording of the first image dataset and thus during the first turbo spin echo sequence.

Preferably the echo time and/or the effective echo time and/or the interecho time can be minimized during the recording of the first image dataset. Minimization means that, in the computation of the wait times, also called delays, a minimization, i.e. a shortest possible time, is to be achieved. Thus the goal is not to have a predetermined echo time and/or effective echo time and/or interecho time, e.g. for generation of a desired contrast, but to have the shortest possible. In relation to the interecho time, this means not providing any unnecessary delays, switching the gradients to be as short as possible, etc.

Preferably the difference between the effective echo times during the recording of the first image dataset and of the second image dataset is less than or equal to the time that the spins of the spin species need to get from the "in-phase" position into the opposed phase position. A small difference can be necessary if the sequence parameters and in particular the shifting of the gradient echo by comparison with the spin echo force this. An SNR that is as comparable as possible is achieved thereby.

Preferably the image datasets can be combined by means of an addition into a combination image. As an alternative, the image datasets can be combined by subtraction into a combination image. In this case information about the $B_0$ magnetic field can be taken into account in each case. For example a $B_0$ map can be used or there can be a signal intensity optimization. In all cases the image datasets are advantageously combined pixel-by-pixel.

Preferably the image datasets have an identical resolution and/or an identical slice thickness and/or an identical FoV. The processing of the Dixon method is thereby simplified, since there is no need for corrections.

During the recording of the image datasets, a body coil or a coil array can be used. In particular the turbo spin echoes can be recorded and evaluated for further acceleration by the use of parallel imaging.

For avoidance of motion artifacts, navigator echoes can be used.

Preferably, the method is executed in a magnetic resonance scanner with a basic magnetic field strength of less than 1.5 T. As described, the method is especially advantageous when the basic magnetic field is inhomogeneous and has a low field strength.

Preferably the method can be implemented by a magnetic resonance scanner with an open architecture. Such a scanner does not have an annular cross-section, but has an arrangement in which the head of the patient is not covered or contained inside the scanner structure.

Preferably a slice selection gradient is activated at the same time as each excitation pulse and/or each refocusing pulse (or pulses). This allows a slice-selective excitation of the spins.

Preferably, after the readout of the echo signals, a phase rewind gradient is applied. This brings the magnetization into the middle of k-space again.

The present invention also encompasses a non-transitory, computer-readable data storage medium encoded with programming instructions (program code) that, when the storage medium is loaded into a computer or computer system of a magnetic resonance apparatus, cause the computer or computer system to operate the magnetic resonance apparatus in order to implement any or all embodiments of the method according to the invention, as described above.

DESCRIPTION OF THE PREFERRED EMBODIMENTS

Figure 1:
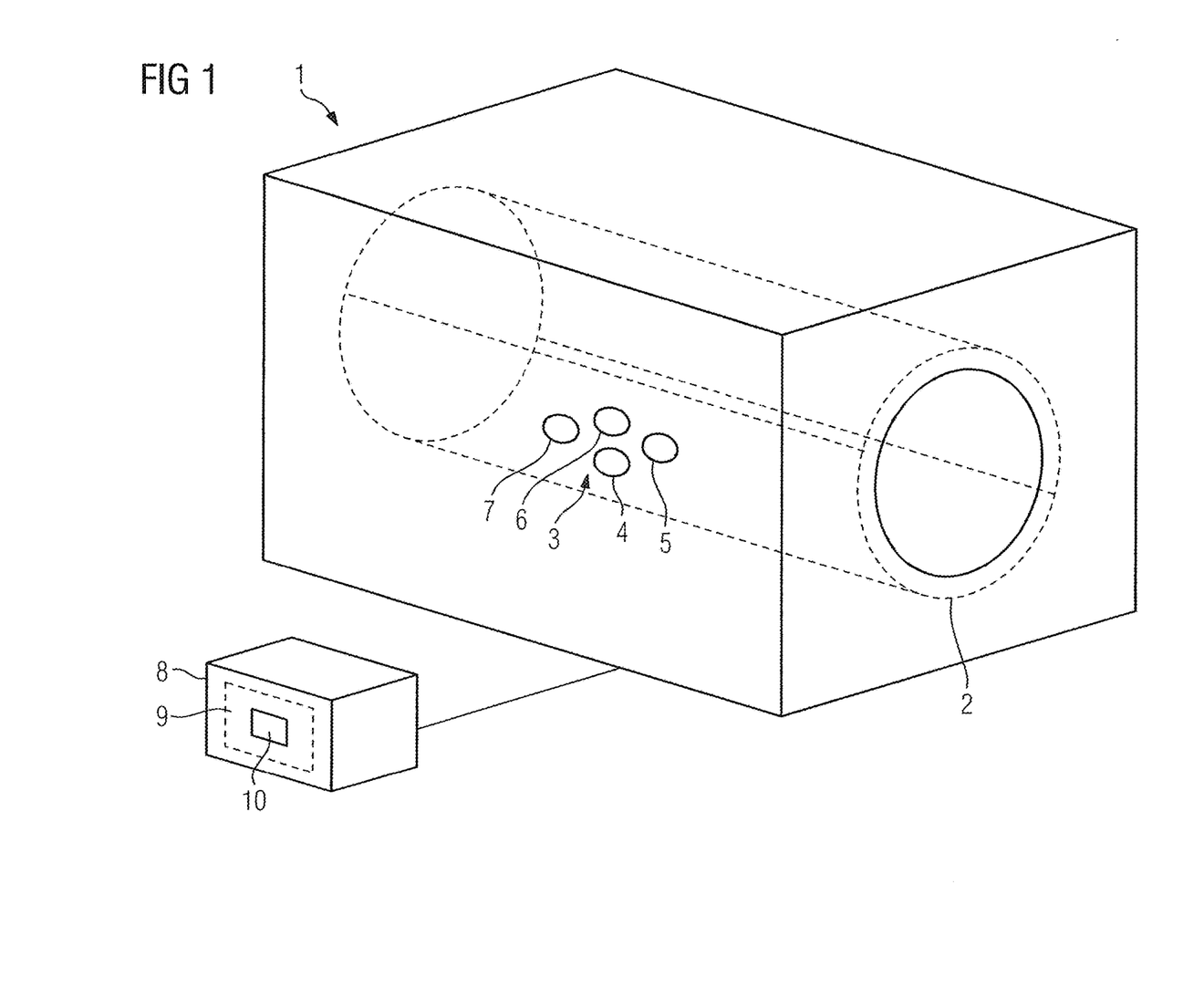
FIG. 1 schematically illustrates a magnetic resonance apparatus.

FIG. 1 shows a magnetic resonance apparatus 1 with a transmit coil arrangement 2. The transmit coil arrangement 2 can be a body coil or a transmit coil array. The transmit coil arrangement 2 is shown by dashed lines.

For data acquisition the magnetic resonance system 1 possesses a receive coil arrangement 3. The receive coil arrangement 3 is preferably a coil array with coils 4, 5, 6 and 7. The coils 4, 5, 6 and 7 detect measurement signals in parallel. Known deconvolution methods such as GRAPPA or SENSE are then used for processing.

To control the measurement sequences, the magnetic resonance apparatus 1 has a control computer 8.

The magnetic resonance apparatus 1 furthermore has a data carrier 9 as part of the control computer 8 or independent thereof, on which computer programs 10 for carrying out magnetic resonance measurements are stored.

For clarity, further components of the magnetic resonance apparatus 1, such as gradient coils and a patient table, are not shown.

Figure 2:
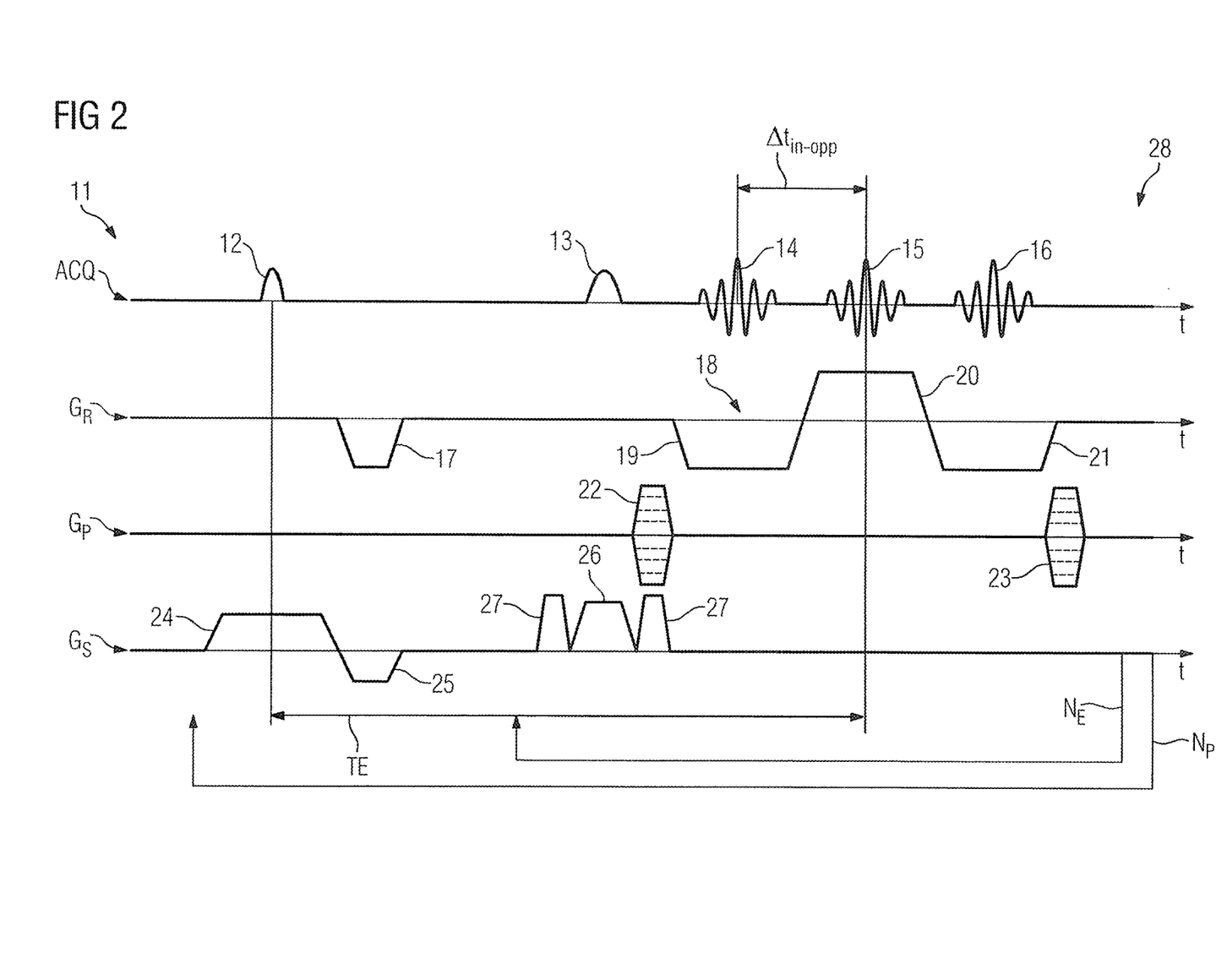
FIG. 2 shows a measurement sequence (prior art).

FIG. 2 shows a known measurement sequence for generating three image datasets for a 3-point Dixon method.

In this case a turbo spin echo is expanded by a gradient echo train so that three image datasets are obtained with one measurement sequence.

The sequence diagram 11 of the turbo spin echo shows an excitation pulse 12, a refocusing pulse 13, two gradient echoes 14 and 16 and also a spin echo 15 in the acquisition row ACQ. The spin echo 15 in precise terms is a spin echo and a gradient echo at the same time. For better differentiation, it will merely be referred to below as a spin echo.

The section as from the refocusing pulse 13 is repeated as often as there are spin echoes to be generated in an echo train. This number is labeled with the letters $N_E$.

In read direction $G_R$ a read dephasing gradient 17 and a gradient echo train 18 with three read gradients 19, 20 and 21 are present. The read gradients 19 and 21 generate the gradient echoes 14 and 16, which are placed so that the spins of the water and fat protons lie in an "opposed phase". The formula for computing the time interval has been given at the start.

In phase direction $G_P$ a phase encoding gradient 22 is present. This is preferably arranged after the refocusing pulse 13. The gradient echo train 18 is followed by a phase gradient 23, with which the phase is reset again. In other words there is a return to the middle of k-space. The amplitude of the gradients 22 and 23 depends in this case on whether, during the generation of the first echo, an initial k-space position is assumed or, as from the second echo, there are fixed steps through k-space.

A slice selection gradient 24 and a slice rephasing gradient 25 follow in slice direction $G_S$. These are used for slice selection during the excitation pulse 12 and for rephasing the spins. During the refocusing pulse 13 a slice selection gradient 26 is likewise present. In addition the refocusing pulse 13 is surrounded by spoiler gradients 27. These serve to spoil imperfections of the refocusing pulse 13.

The interecho time TI is defined via the refocusing pulses 13 and the spin echoes 15. This mostly corresponds to the echo time TE, but does not have to. The effective echo time $TE_{eff}$ is produced via the excitation pulse 12 and the echo 14 or 15 of the central k-space row.

Np refers to the number of excitation cycles produced. At its maximum, it is the same size as the number of phase-encoding steps, but is usually much smaller. Np decreases because of the number of echoes recorded in a train, but in parallel imaging only some of the phase-encoding steps are actually undertaken.

With the image datasets recorded by the measurement sequence 28 shown in the sequence diagram 11, a water image and/or a fat image can be obtained in a 3-point Dixon method.

With small field strengths, i.e. field strengths of less than 1.5 T, and in particular with an open scanner architecture, the method described requires long measurement times.

In order to avoid this the following method is applied in accordance with the invention.

Figure 3:
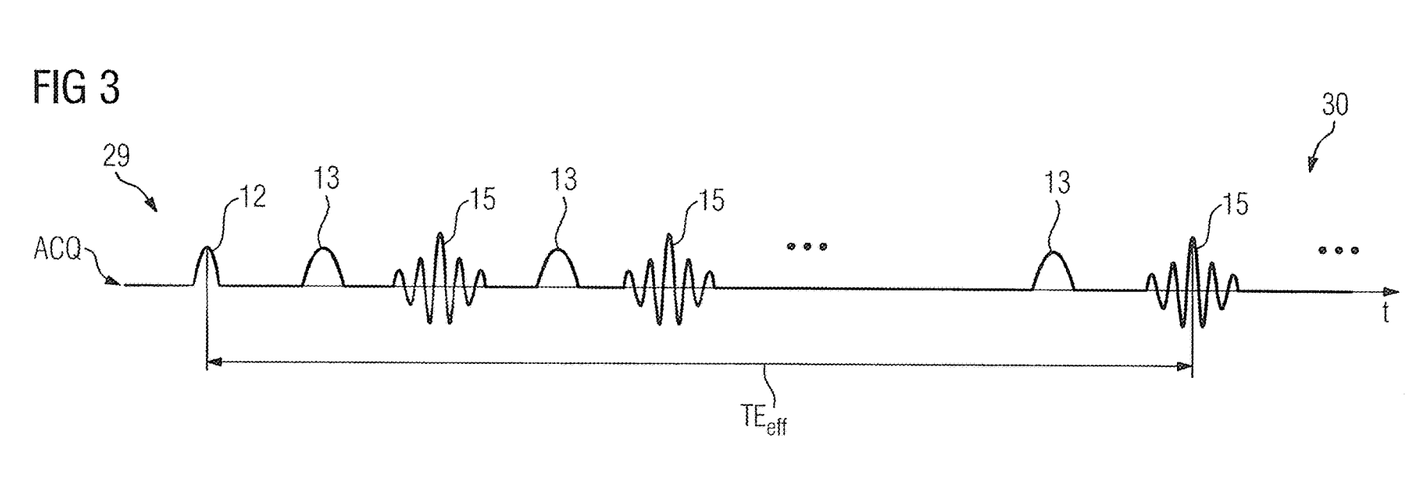
FIG. 3 shows a first measurement sequence in accordance with the invention.

FIG. 3 shows a part of a sequence diagram 29 of a measurement sequence 30. The measurement sequence 30 is a turbo spin echo sequence. Only the acquisition row ACQ of said sequence is shown. During the measurement sequence 30 only spin echoes 15 are acquired. Otherwise all wait times are eliminated, so that a maximum number of echoes can be recorded in an echo train. In this way for example, instead of fifteen spin echoes in an echo train, twenty-four spin echoes can be recorded in an echo train.

By comparison with FIG. 2, only the read gradients 19 and 21 are to be left out and the interecho time TI is to be minimized in order to achieve the success described.

It is again noted that with the measurement sequence 30, k-space rows for an image dataset are obtained, in which the spins of water and fat protons, or more generally of two spin species, are "in phase".

Figure 4:
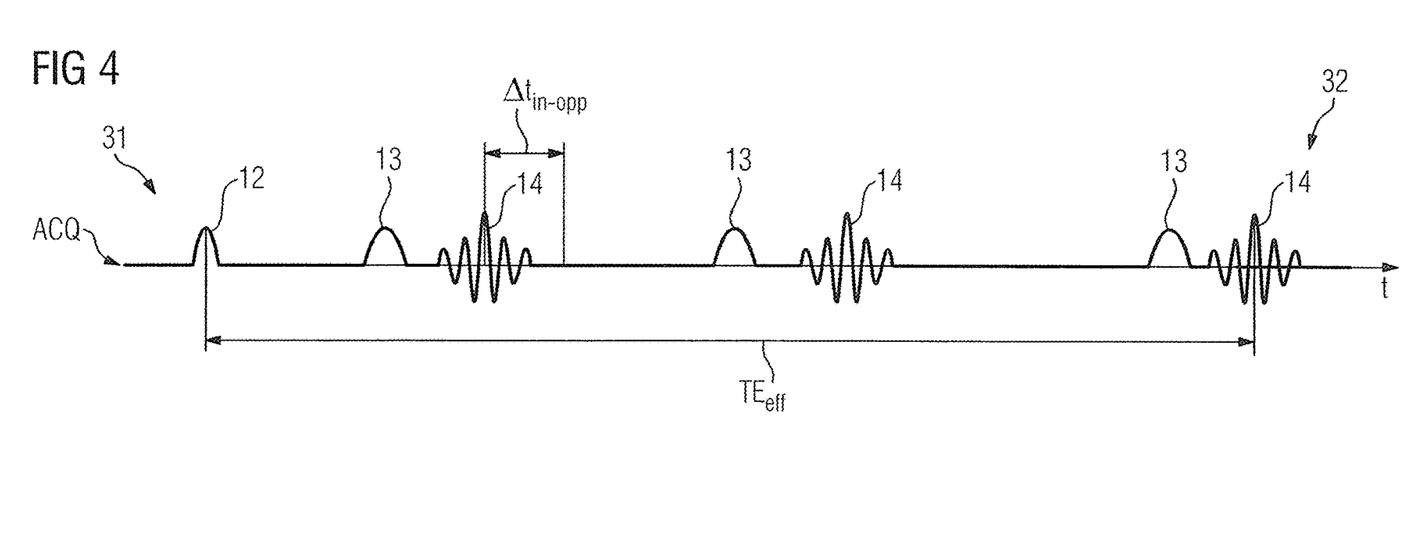
FIG. 4 shows a second measurement sequence in a first embodiment in accordance with the invention.

FIG. 4 shows a part of a sequence diagram 31 of a further measurement sequence 32. The measurement sequence 32 is also a turbo spin echo sequence. This is used for recording gradient echoes 14 and thus measurement data, in which the spins of two spin species are oriented in phase opposition. As in FIG. 3 only the acquisition row ACQ is shown.

The read gradients 20 and 21 can be left out or switched. Although the spin echo 15 arises, it is not read out. Otherwise the measurement sequence 32 can be embodied like the measurement sequence 28. The gradient echo 16 is generated and read out if it is to be used for a 3-point Dixon method.

Thus, instead of one measurement sequence 28, two optimized measurement sequences 30 and 32 are used. A comparison of FIGS. 3 and 4 shows that the interecho time TI in the measurement sequence 30 and in this case in the sequence for recording the first image dataset is shorter than in the measurement sequence 32, which is used for recording the second image dataset. The echo time TE is also shorter in the measurement sequence 30.

The effective echo time $TE_{eff}$ is roughly the same length. The difference is at a maximum as long as the time interval $\Delta t_{in-opp}$.

Figure 5:
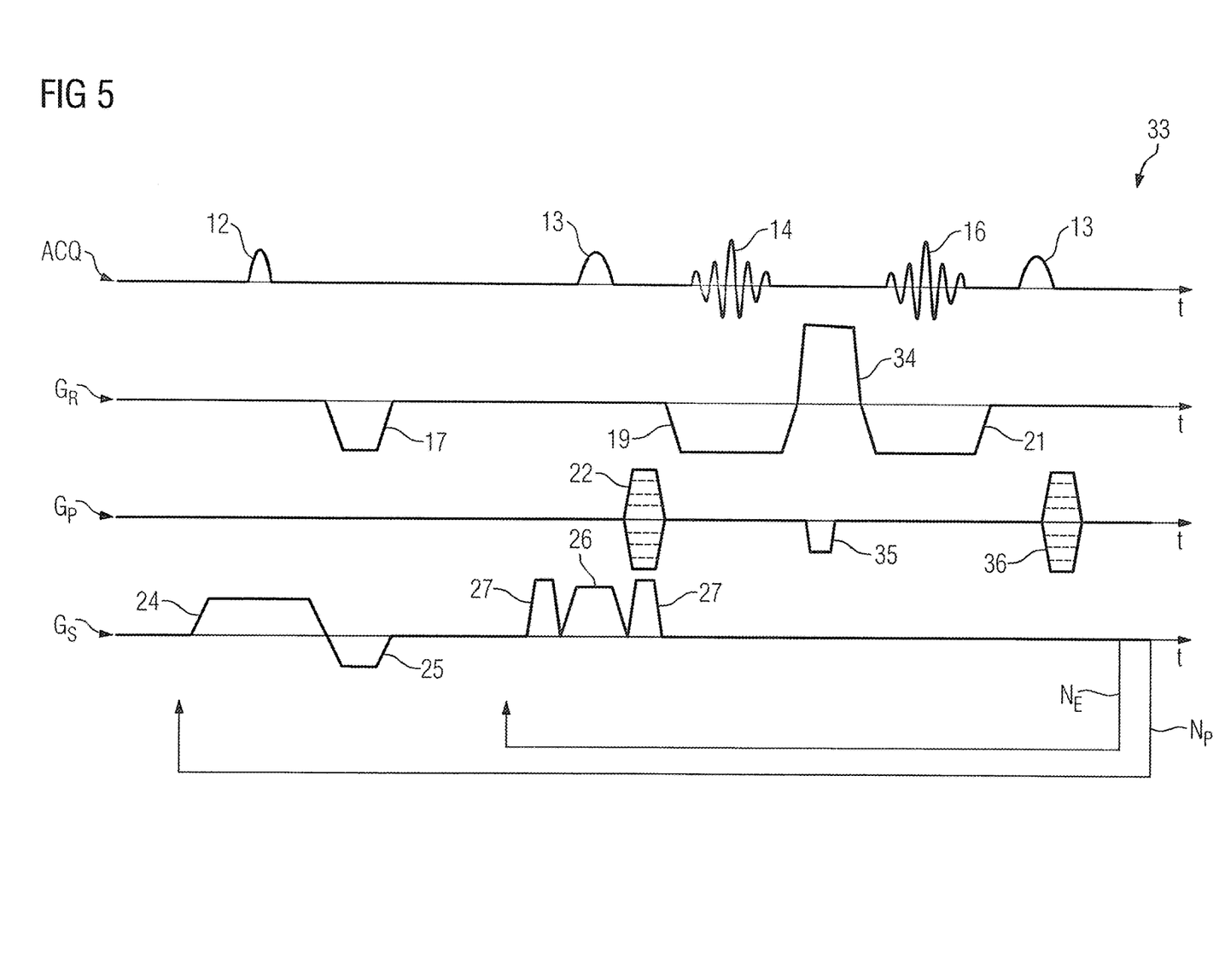
FIG. 5 shows the second measurement sequence in a second embodiment in accordance with the invention.

FIG. 5 shows an alternate embodiment of the measurement sequence 32 from FIG. 4 in the form of the measurement sequence 33. In this case, as well as the acquisition row ACQ, the gradients are also shown. Unlike in FIG. 4, there is a gradient 34 between the read gradients 19 and 21. Although this possesses the same surface as the gradients 19 and 21, it is switched more strongly and for a shorter time. This enables the read gradients 19 and 21 to be shifted towards the center of the echo of the spin echo 15. The gradient 33 can also be called a flyback gradient. Since the spin echo 15 is not read out, the gradient 34 does not encode any location information and can therefore be embodied in any given way.

A phase gradient 35 can be applied in parallel to the gradient 34 in the phase direction. This makes sure of a continuation by a defined number of k-space rows in k-space. This enables a further row of the second image dataset to be obtained with the gradient echo 16. Thus two k-space rows can be obtained per refocusing pulse and thus twice as many gradient echoes as spin echoes in the echo train.

The phase gradient 36 is a phase rewinder, which in the embodiment shown possesses the difference surface between phase encoding gradient 22 and phase gradient 35.

Overall the measurement sequences 30 and 32 or 30 and 33 produce an "in-phase" image and an opposed phase image, which can be combined by addition or subtraction into a combination image as a water image or a fat image in each case.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating a magnetic resonance (MR) image, comprising:
    operating an MR data acquisition scanner so as to implement a first execution of a turbo spin echo sequence in which echo signals, respectively originating from nuclear spins of two different spin species in a region of an object, are acquired, with a timing of acquisition of said echo signals in said first execution of said turbo spin echo sequence causing said echo signals to be acquired in phase with each other in said first execution of said turbo spin echo sequence in order to fulfill an in-phase condition;
    operating said MR data acquisition scanner in order to implement a second execution of said turbo spin echo sequence in which echo signals are also acquired that originate respectively from the nuclear spins of said two different spin species in said region, with acquisition of the echo signals in said second execution of said turbo spin echo sequence being timed so that the echo signals acquired in said second execution of said turbo spin echo sequence are in opposite phase with respect to each other in order to fulfill an opposite-phase condition, wherein each of said first and second executions of said turbo spin echo sequence comprises an echo time and an interecho time, and comprising operating said MR data acquisition scanner so as to implement said first execution of said turbo spin echo sequence with the echo time thereof being smaller than the echo time in the second execution of said turbo spin echo sequence, or operating the MR data acquisition scanner so as to implement said first execution of said turbo spin echo sequence of said turbo spin echo sequence;

providing said echo signals acquired in said first execution of said turbo spin echo sequence and said echo signals acquired in said second execution of said turbo spin echo sequence to a computer and, in said computer, reconstructing a first image dataset from the echo signals acquired with said first execution of said turbo spin echo sequence and reconstructing a second image dataset from the echo signals acquired in the second execution of said turbo spin echo sequence; and in said computer, combining said first image dataset and said second image dataset so as to form a combination MR image, and making the combination MR image available from the computer in electronic form, as a data file.

2. A method as claimed in claim 1 comprising operating said MR data acquisition scanner so as to implement said second execution of said turbo spin echo sequence with activation of at least one refocusing pulse, after which at least two echo signals are acquired.

3. A method as claimed in claim 2 comprising reconstructing said second image dataset from all of said at least two echo signals acquired in the second execution of said turbo spin echo sequence.

4. A method as claimed in claim 2 comprising operating said MR data acquisition scanner so as to implement said second execution of said turbo spin echo sequence in order to acquire said at least two echo signals as gradient echoes.

5. A method as claimed in claim 4 comprising acquiring said at least two echo signals as gradient echoes by activating bipolar gradients in said second execution of said turbo spin echo sequence.

6. A method as claimed in claim 4 comprising acquiring said at least two echo signals as gradient echoes by activating gradients of a same polarity in the second execution of said turbo spin echo sequence.

7. A method as claimed in claim 1 comprising operating said MR data acquisition scanner so as to implement said first execution of said turbo spin echo sequence by activating a higher number of refocusing pulses therein than are activated in the second execution of said turbo spin echo sequence.

8. A method as claimed in claim 1 comprising operating said MR data acquisition scanner so as to implement said first execution of said turbo spin echo sequence with an echo time, an effective echo time, and an interecho time, with at least one of said echo time, said effective echo time, and said interecho time being minimized.

9. A method as claimed in claim 1 comprising operating said MR data acquisition scanner so as to implement each of said first execution and said second execution of said turbo spin echo sequence with an effective echo time, with a difference between the respective effective echo times in said first and second executions of said turbo spin echo sequence being less than or equal to a time required for said nuclear spins of said two different spin species to change from an in-phase state to an opposed-phase state.

10. A method as claimed in claim 1 comprising using, as said MR data acquisition scanner, an MR data acquisition scanner with a basic field magnet having a field strength that is less than 1.5 T.

11. A method as claimed in claim 1 comprising operating said MR data acquisition scanner so as to acquire said echo signals in each of said first and second executions of said turbo spin echo sequence with a radio-frequency coil array.

12. A magnetic resonance (MR) apparatus comprising:

an MR data acquisition scanner;

a computer configured to operate said MR data acquisition scanner so as to implement a first execution of a turbo spin echo sequence in which echo signals, respectively originating from nuclear spins of two different spin species in a region of an object, are acquired, with a timing of acquisition of said echo signals in said first execution of said turbo spin echo sequence causing said echo signals to be acquired in phase with each other in said first execution of said turbo spin echo sequence in order to fulfill an in-phase condition;

said computer being configured to also operate said MR data acquisition scanner in order to implement a second execution of said turbo spin echo sequence in which echo signals are also acquired that originate respectively from the nuclear spins of said two different spin species in said region, with acquisition of the echo signals in said second execution of said turbo spin echo sequence being timed so that the echo signals acquired in said second execution of said turbo spin echo sequence are in opposite phase with respect to each other in order to fulfill an opposite-phase condition, wherein each of said first and second executions of said turbo spin echo sequence comprises an echo time and an interecho time, and said computer being configured to operate said MR data acquisition scanner so as to implement said first execution of said turbo spin echo sequence with the echo time thereof being smaller than the echo time in the second execution of said turbo spin echo sequence, or said computer being configured to operate the MR data acquisition scanner so as to implement said first execution of said turbo spin echo sequence with said interecho time thereof being smaller than the interecho time in said execution of said turbo spin echo sequence;

said computer being provided with said echo signals acquired in said first execution of said turbo spin echo sequence and said echo signals acquired in said second execution of said turbo spin echo sequence to a computer, and said computer being configured to reconstruct a first image dataset from the echo signals acquired with said first execution of said turbo spin echo sequence and to reconstruct a second image dataset from the echo signals acquired in the second execution of said turbo spin echo sequence; and said computer being configured to combine said first image dataset and said second image dataset so as to form a combination MR image, and to make the combination MR image available from the computer in electronic form, as a data file.

13. A non-transitory, computer-readable data storage medium encoded with programming instructions, said storage medium being loaded into a computer of a magnetic resonance (MR) apparatus comprising an MR data acquisition scanner, said programming instructions causing said computer to:
  operate said MR data acquisition scanner so as to implement a first execution of a turbo spin echo sequence in which echo signals, respectively originating from nuclear spins of two different spin species in a region of an object, are acquired, with a timing of acquisition of said echo signals in said first execution of said turbo spin echo sequence causing said echo signals to be acquired in phase with each other in said first execution of said turbo spin echo sequence in order to fulfill an in-phase condition;
  operate said MR data acquisition scanner in order to implement a second execution of said turbo spin echo sequence in which echo signals are also acquired that originate respectively from the nuclear spins of said two different spin species in said region, with acquisition of the echo signals in said second execution of said turbo spin echo sequence being timed so that the echo signals acquired in said second execution of said turbo spin echo sequence are in opposite phase with respect to each other in order to fulfill an opposite-phase condition,
  wherein each of said first and second executions of said turbo spin echo sequence comprises an echo time and interecho time, and said programming instructions causing said computer to operate said MR data acquisitions scanner so as to implement said first execution of said turbo spin echo sequence with the echo time thereof being smaller than the echo time in the second execution of said turbo spin echo sequence, or operating the MR data acquisition scanner so as to implement said first execution of said turbo spin echo sequence with said interecho time thereof being smaller than the interecho time in said second execution of said turbo spin echo sequence;
  receive said echo signals acquired in said first execution of said turbo spin echo sequence and said echo signals acquired in said second execution of said turbo spin echo sequence to a computer and reconstruct a first image dataset from the echo signals acquired with said first execution of said turbo spin echo sequence and reconstruct a second image dataset from the echo signals acquired in the second execution of said turbo spin echo sequence; and
  combine said first image dataset and said second image dataset so as to form a combination MR image, and make the combination MR image available from the computer in electronic form, as a data file.

* * * * *